United States Patent
Lin et al.

(10) Patent No.: US 10,444,807 B2
(45) Date of Patent: Oct. 15, 2019

(54) HEAT SINK ASSEMBLY AND FAN AND FAN MODULE THEREOF

(71) Applicant: COOLER MASTER TECHNOLOGY INC., New Taipei (TW)

(72) Inventors: Pei-Chiang Lin, New Taipei (TW); Yu-Te Wei, New Taipei (TW)

(73) Assignee: COOLER MASTER TECHNOLOGY INC., New Taipei (TW)

( * ) Notice: Subject to any disclaimer, the term of this patent is extended or adjusted under 35 U.S.C. 154(b) by 212 days.

(21) Appl. No.: 14/939,339

(22) Filed: Nov. 12, 2015

(65) Prior Publication Data

US 2017/0075394 A1   Mar. 16, 2017

(30) Foreign Application Priority Data

Sep. 10, 2015   (CN) .................. 2015 2 0698870 U

(51) Int. Cl.
  *G06F 1/20*   (2006.01)
  *H05K 7/20*   (2006.01)

(52) U.S. Cl.
  CPC ........... *G06F 1/20* (2013.01); *H05K 7/20336* (2013.01)

(58) Field of Classification Search
  CPC ........... H05K 7/20136; H05K 7/20172; H05K 7/20336; H05K 7/20154; F28D 2021/0029; F28F 2280/00; F28F 2280/02; F28F 2280/04; F28F 2280/06
  USPC ................................ 165/80.3; 361/710, 697
  See application file for complete search history.

(56) References Cited

U.S. PATENT DOCUMENTS

| | | | | | |
|---|---|---|---|---|---|
| 5,927,389 | A | * | 7/1999 | Gonsalves | H05K 7/20172 165/121 |
| 6,654,246 | B2 | * | 11/2003 | Wu | H01L 23/467 165/121 |
| 6,667,882 | B2 | * | 12/2003 | Pauser | H01L 23/467 165/80.3 |
| 7,423,873 | B2 | * | 9/2008 | Shuai | H01L 23/467 165/185 |
| 2003/0198016 | A1 | * | 10/2003 | Wobig | G06F 1/20 361/679.47 |
| 2007/0119567 | A1 | * | 5/2007 | Yeh | H01L 23/467 165/80.3 |
| 2008/0019094 | A1 | * | 1/2008 | Xia | H01L 23/3672 361/700 |
| 2011/0240258 | A1 | * | 10/2011 | Yang | F28D 15/0275 165/67 |
| 2012/0067554 | A1 | * | 3/2012 | Chen | G06F 1/20 165/138 |
| 2012/0085883 | A1 | * | 4/2012 | Lu | H05K 7/20172 248/672 |

* cited by examiner

*Primary Examiner* — Tho V Duong
(74) *Attorney, Agent, or Firm* — Maschoff Brennan

(57) ABSTRACT

A heat sink assembly and a fan and a fan module thereof, the heat sink assembly includes a heat sink (1), a heat sink rack and a fan module. The fan module includes a fan rack (3) and a fan (4). The heat sink rack is installed on the heat sink (1). The heat sink rack includes a first sliding portion (200), and the fan rack (3) or the fan (4) includes a second sliding portion (31). The first sliding portion (31) is configured corresponding to the first sliding portion (200) with a slidable cooperation in order to allow the fan rack (3) or the fan (4) to use the cooperation between the first sliding portion (200) and the second sliding portion (31) to slide in a predefined direction.

11 Claims, 10 Drawing Sheets

HEAT SINK ASSEMBLY AND FAN AND FAN MODULE THEREOF

BACKGROUND OF THE INVENTION

Field of the Invention

The present invention is related to a heat sink assembly, in particular, to a heat sink assembly and a fan and a fan module thereof.

Description of Related Art

For a traditional heat sink used in a central processing unit (CPU) or a graphic processing unit (GPU) of a computer, it is typically installed with a fan on the heat sink in order to utilize the forced air convection provided by the fan to dissipate the heat such that the effect of heat dissipation is enhanced.

With respect to the design of a typical fan, the larger the fan, the stronger the forced convection generated. Nevertheless, in situation where a fan is used in conjunction with a typical heat sink, a fan of a larger size may not be used, but rather, a smaller fan may be used in conjunction by the manufacturer due to cost concerns. In addition, for the assembly, such fan may not allow replacements by the user but requires the method of screw fastening and removal for the replacement of the fan, which causes inconvenience to the user. Furthermore, due to the inconvenience associated with the assembly of the traditional fan, the adjustment on the installation position is also difficult such that the actual configuration and installation of the heat sink cannot be adjusted properly according to the actual needs of the location of the heat sink.

In view of the above, after years of research and development along with the utilization of theoretical principles, the inventor of the present invention seeks to provide an improvement capable of overcoming the aforementioned drawbacks.

SUMMARY OF THE INVENTION

A primary objective of the present invention is to provide a heat sink and a fan and a fan module thereof, which is to provide a fan rack disposed between the heat sink and the fan such that the user is able to utilize the fan rack to achieve the objective of facilitated installation and removal of the fan.

To achieve the aforementioned objective, the present invention provides a heat sink assembly, comprising a heat sink, heat sink rack and a fan rack; wherein the heat sink rack is arranged on the heat sink, and the heat sink rack includes a first sliding portion; and the fan rack includes a second sliding portion, the second sliding portion is configured corresponding to the first sliding portion with a slidable cooperation in order to allow the fan rack to use the cooperation between the first sliding portion and the second sliding portion to slide in a predefined direction.

To achieve the aforementioned objective, the present invention provides a heat sink assembly, comprising a heat sink, a heat sink rack and a fan; wherein the heat sink rack is arranged on the heat sink, and the heat sink rack includes a first sliding portion; and the fan includes a second sliding portion, the second sliding portion is configured corresponding to the first sliding portion with a slidable cooperation in order to allow the fan to use the cooperation between the first sliding portion and the second sliding portion to slide in a predefined direction.

To achieve the aforementioned objective, the present invention provides a fan, adapted to be detachably arranged on a heat sink, and the heat sink having a first sliding portion, the fan is characterized in that: the fan includes a second sliding portion configured corresponding to the first sliding portion with a slidable cooperation in order to allow the fan to use the cooperation between the first sliding portion and the second sliding portion to slide in a predefined direction.

DETAILED DESCRIPTION OF THE INVENTION

The following provides a detailed description on the embodiments and technical content related to the present invention along with the accompanied drawings. However, it shall be understood that the accompanied drawings are provided for illustration purposes only and shall not be treated as limitations of the present invention.

Figure 1:
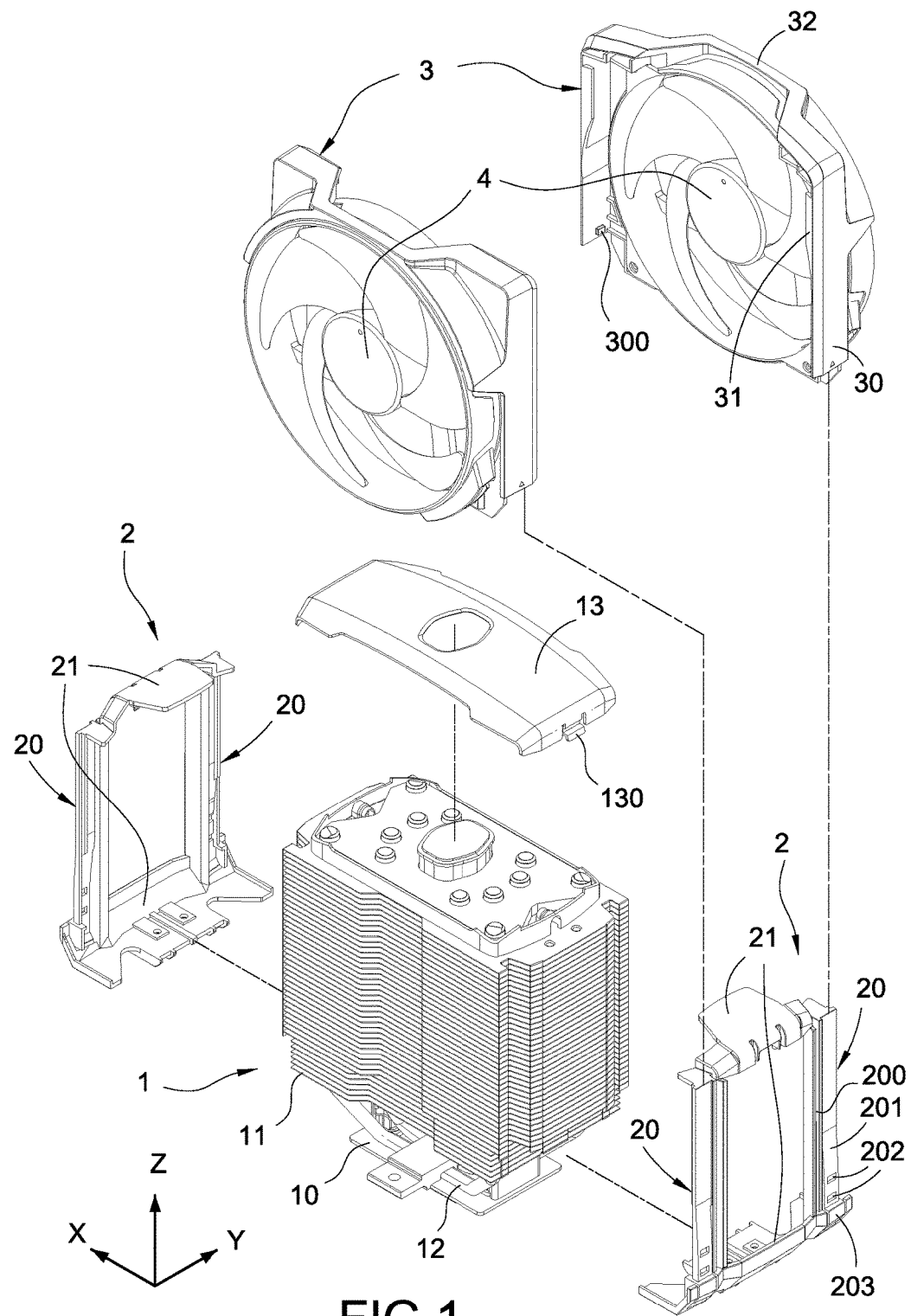
FIG. 1 is a perspective exploded view of a heat sink assembly of the present invention.
Figure 2:
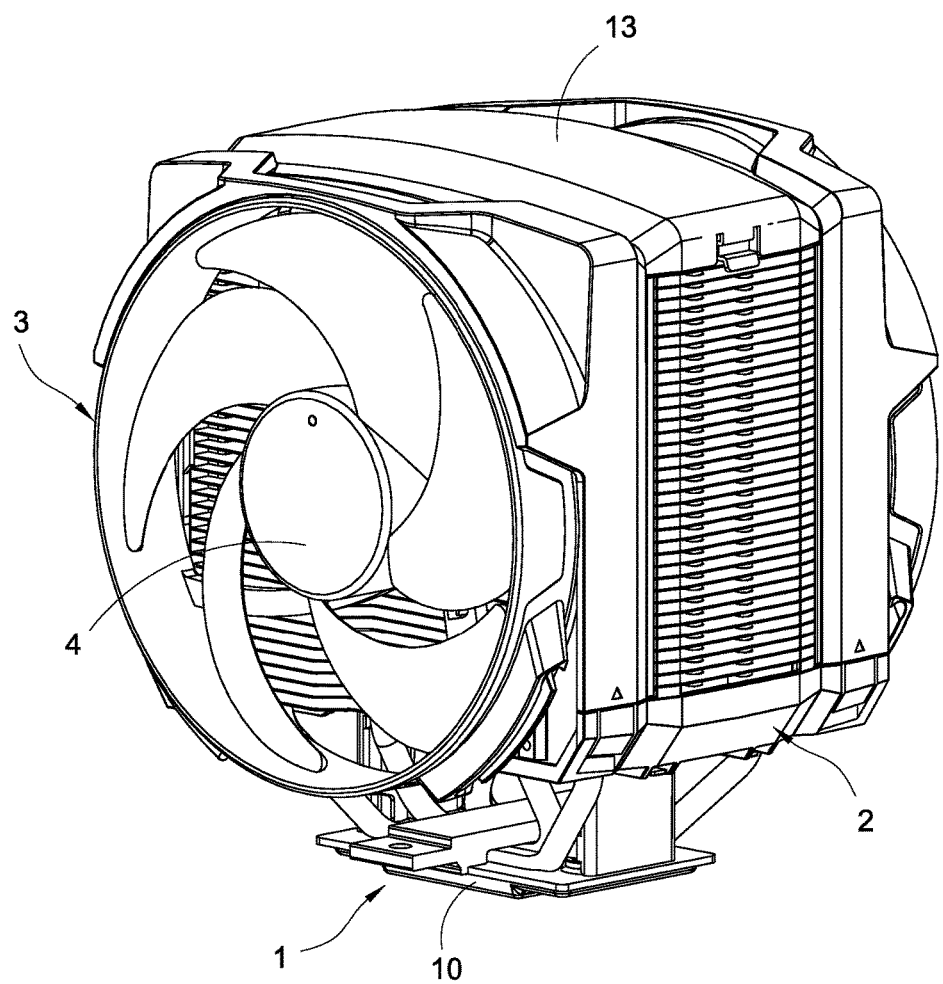
FIG. 2 is a perspective assembly view of a heat sink assembly the present invention.
Figure 3:
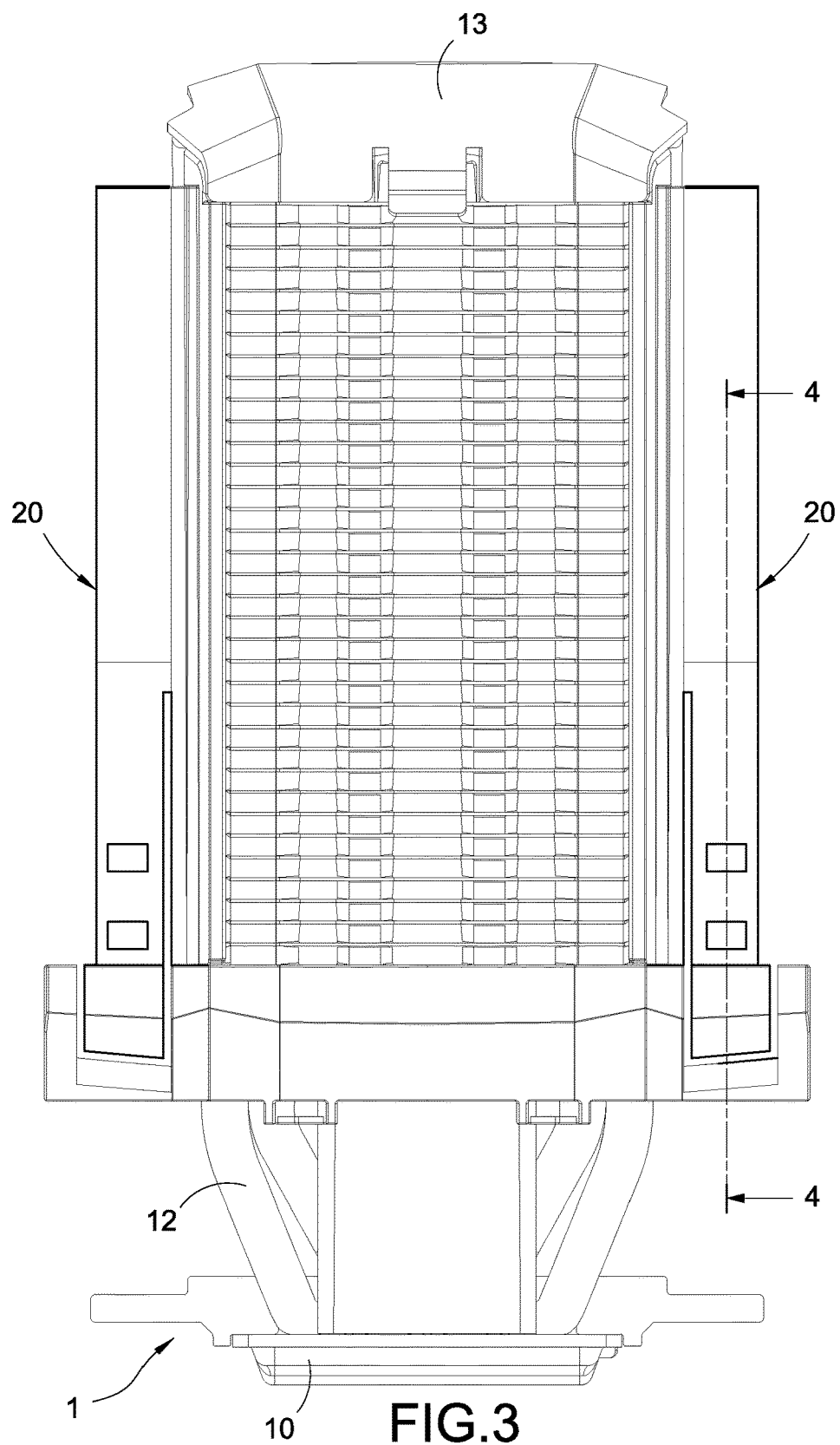
FIG. 3 is a side view of a heat sink assembly of the present invention.

Please refer to FIG. 1, FIG. 2 and FIG. 3, showing a perspective exploded view, a perspective assembly view and a side view of a heat sink assembly of the present invention. The present invention provides a heat sink assembly and a fan and a fan module thereof. The heat sink assembly comprises a heat sink 1, a heat sink rack and a fan module. The fan module comprises a fan rack 3 and a fan 4. The heat sink rack is installed on the heat sink 1 and is configured corresponding to the fan rack 3 or the fan 4 with a slidable cooperation; wherein:

The heat sink 1 can be an aluminum extruded heat sink or a stacked heat sink, which comprises a base 10 and a plurality of fins 11 formed on the base 10. In an embodiment of the present invention, the heat sink 1 is a stacked heat sink, and the fins 11 are stacked on top of the base 10 and spaced apart from each other. One or a plurality of heat pipes 12 are disposed between the base 10 and the fins 11, and the heat pipe(s) 12 penetrates through the plurality of fins 11 to attach onto the base 10.

The heat sink rack is installed on the heat sink 1 in order to allow the fan module to be installed onto the heat sink rack, following which the fan 4 of the fan module can then provide a forced convection to the fins 11 of the heat sink 1. The heat sink rack comprises a pair of brackets 2, and each of the pair of brackets 2 includes a first attachment portion 20 and a frame portion 21 for the first attachment portion 20 to attach onto the fins 11 of the heat sink 1. The first attachment portion 20 extends along a predefined direction, and the predefined direction can be any one of the directions along the length, width and height of the heat sink 1, which refers to the X axis, Y axis and Z axis as shown in FIG. 1 but it is not limited to such directions only. In one embodiment, the present invention uses the Z axis as an example, meaning that it extends along the direction of the height of the heat sink 1, and a first sliding portion 200 is formed on the first attachment portion 20 along its direction of extension (referring to the aforementioned predefined direction). The present invention mainly uses the structure of the heat sink rack having the first sliding portion 200 to allow heat sink 1 utilizing the first sliding portion 200 of the heat sink rack to cooperate with the fan rack 3 or the fan 4 of the fan module such that the fan rack 3 or the fan 4 is able to slide in the predefined direction.

The fan module comprises a fan rack 3 and a fan 4, and it cooperates with the heat sink rack. The fan 4 is installed on the fan rack 3, and the fan rack 3 includes a pair of second attachment portions 30 arranged to circumference an outer of the fan 4. The pair of second attachment portions 30 include a second sliding portion 31 formed thereon respectively, and the second sliding portions 31 is configured corresponding to the first sliding portions 200 with a slidable cooperation in order to allow the fan rack 3 to be installed between the two brackets 2 of the heat sink rack and to allow the fan 4 to be detachably arranged on the heat sink 1. Furthermore, in other embodiments, the fan 4 has the second sliding portions 31. Therefore, the fan rack 3 or the fan 4 is allowed to utilize the second sliding portion 31 to cooperate with the first sliding portion 200 of the heat sink rack such that the fan rack 3 or the fan 4 is able to slide in the predefined direction.

According to the above, in one embodiment of the present invention, a quantity of the first attachment portion 20 of the pair of brackets 2 is two and they are arranged in a parallel spaced apart from each other. In addition, a quantity of the fan rack 3 is also two in order to allow the two fan racks 3 to be installed thereon respectively such that it also allows a quantity of the fan installed on the heat sink 1 to be two. Furthermore, the two first attachment portions 20 can be further installed onto the fins 11 via the two frame portions 21. The two frame portions 21 can be designed to have an attachment structure with an outer appearance corresponding to the fins 11. Moreover, to facilitate the pair of brackets 2 to be installed onto the fins, a cover plate 13 can be provided on top of the fins 11 of the heat sink 1, and the cover plate 13 includes a locking portion 130 formed at an area corresponding to the pair of the brackets 2 in order to allow the pair of brackets 2 to be locked onto the locking portion 130 respectively for attachment therebetween. Furthermore, the first sliding portion 200 can be a sliding slot, and the second sliding portion 31 can also be a sliding track cooperating therewith, and vice versa. It shall be noted that: the quantities of the first attachment portion 20, the fan rack 3 and the fan 4 are all two as recited above; however, such configuration is provided as an exemplary embodiment for illustration purpose only, and the present invention is not limited to such configuration.

Figure 4:
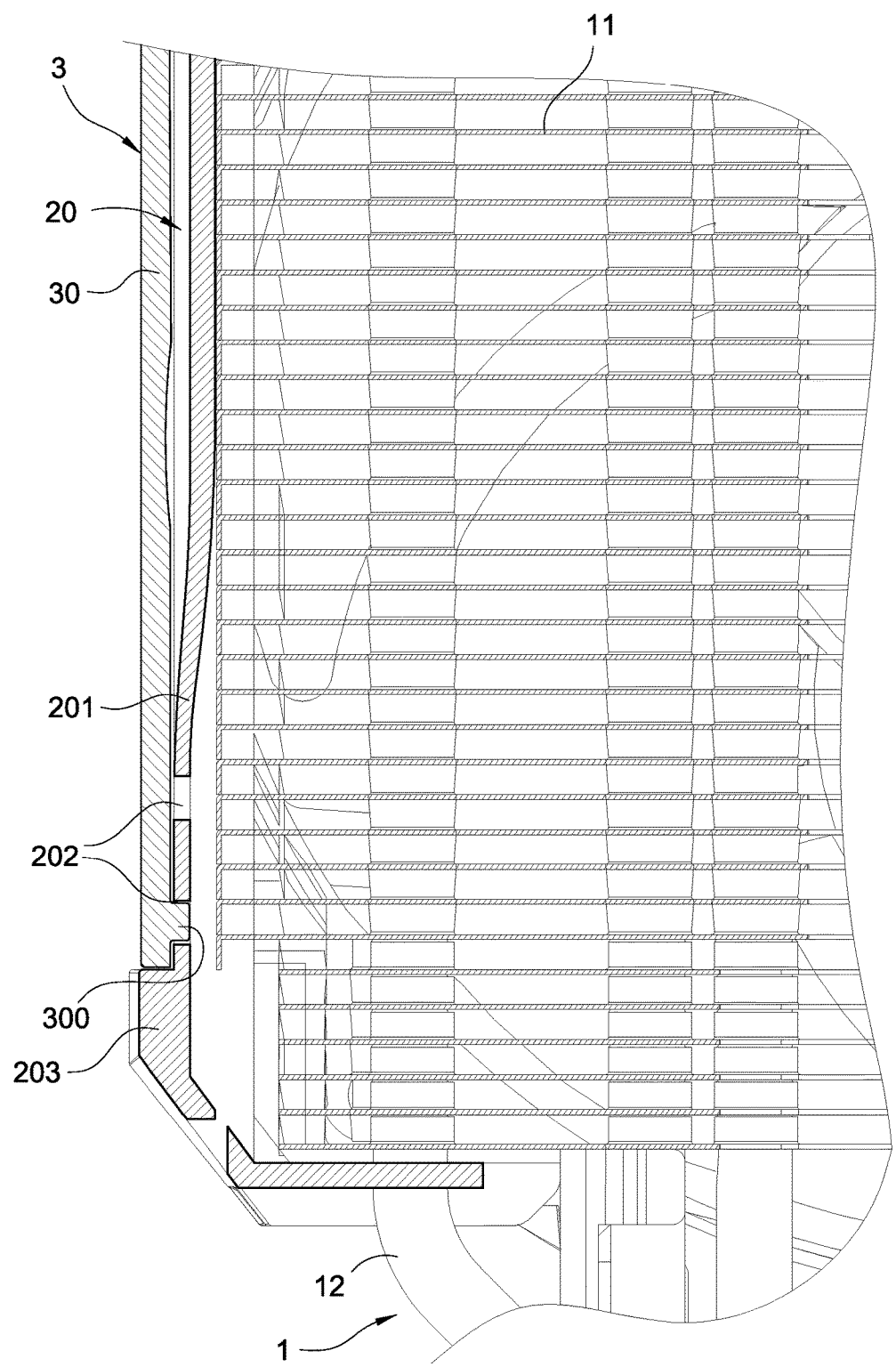
FIG. 4 is a cross sectional view along line 4-4 in FIG. 3.
Figure 5:
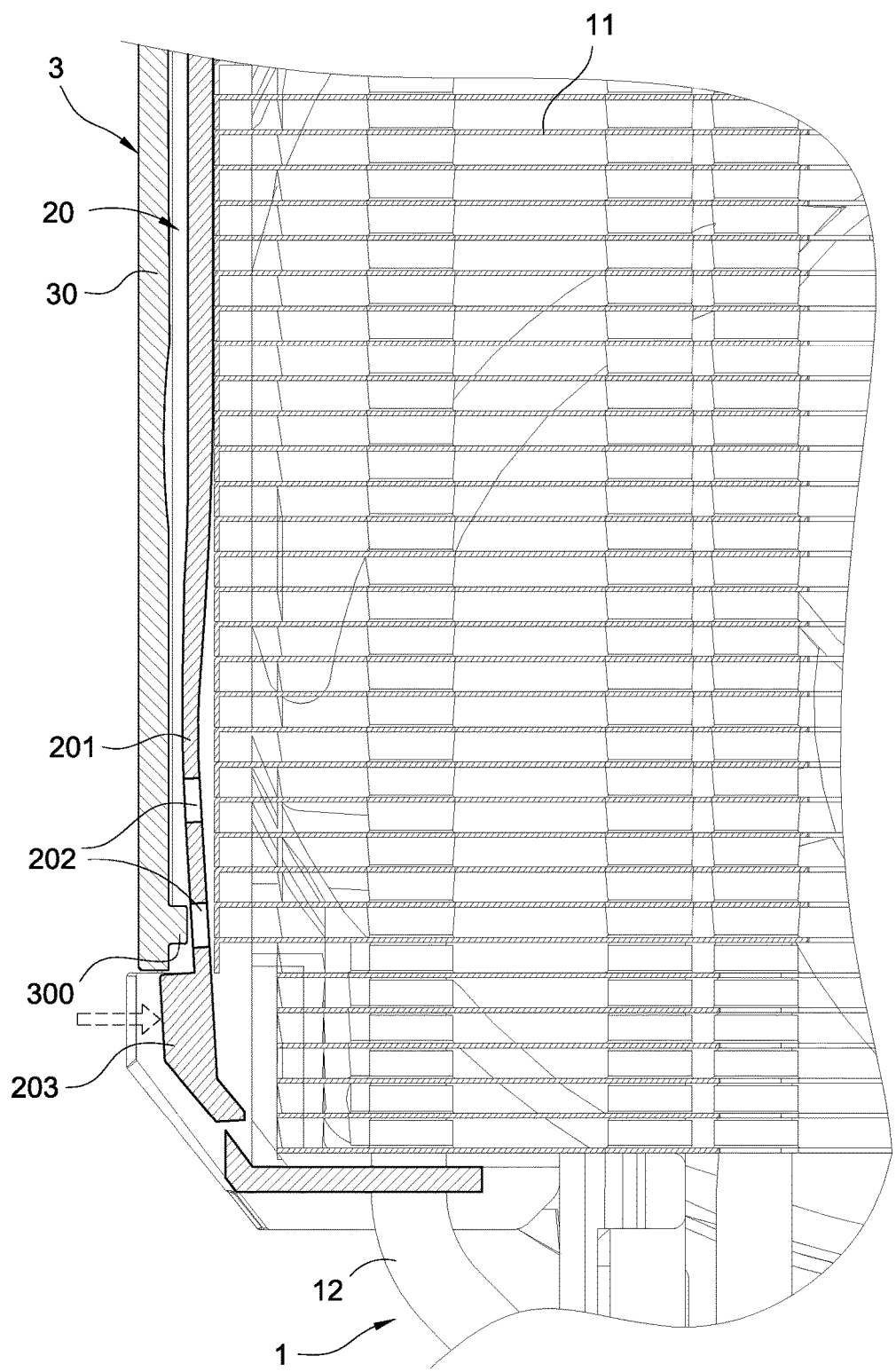
FIG. 5 is an actuation illustration (1) showing an adjustment of the fan module according to FIG. 4.
Figure 6:
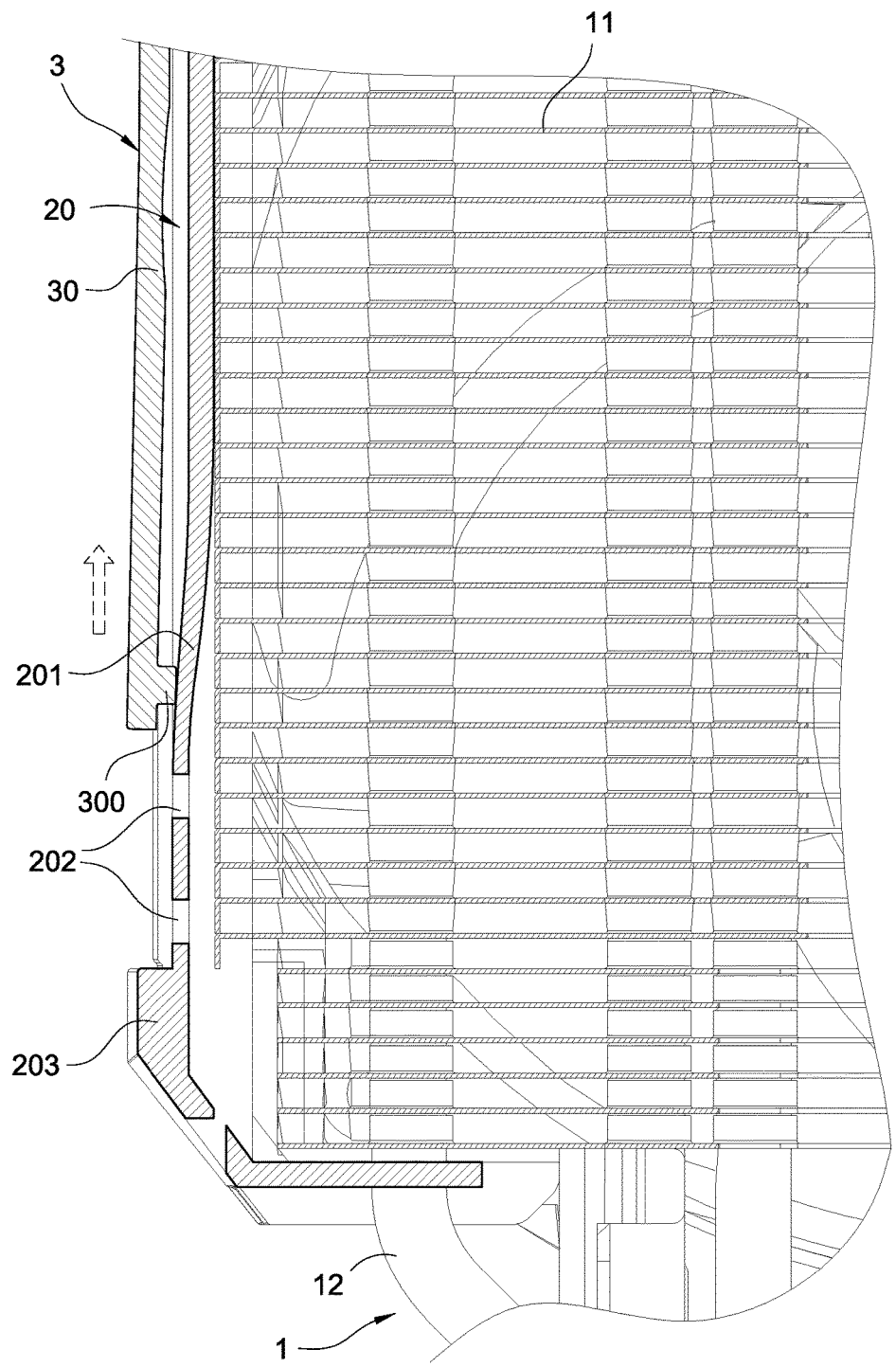
FIG. 6 is an actuation illustration (2) showing an adjustment of the fan module according to FIG. 4.
Figure 7:
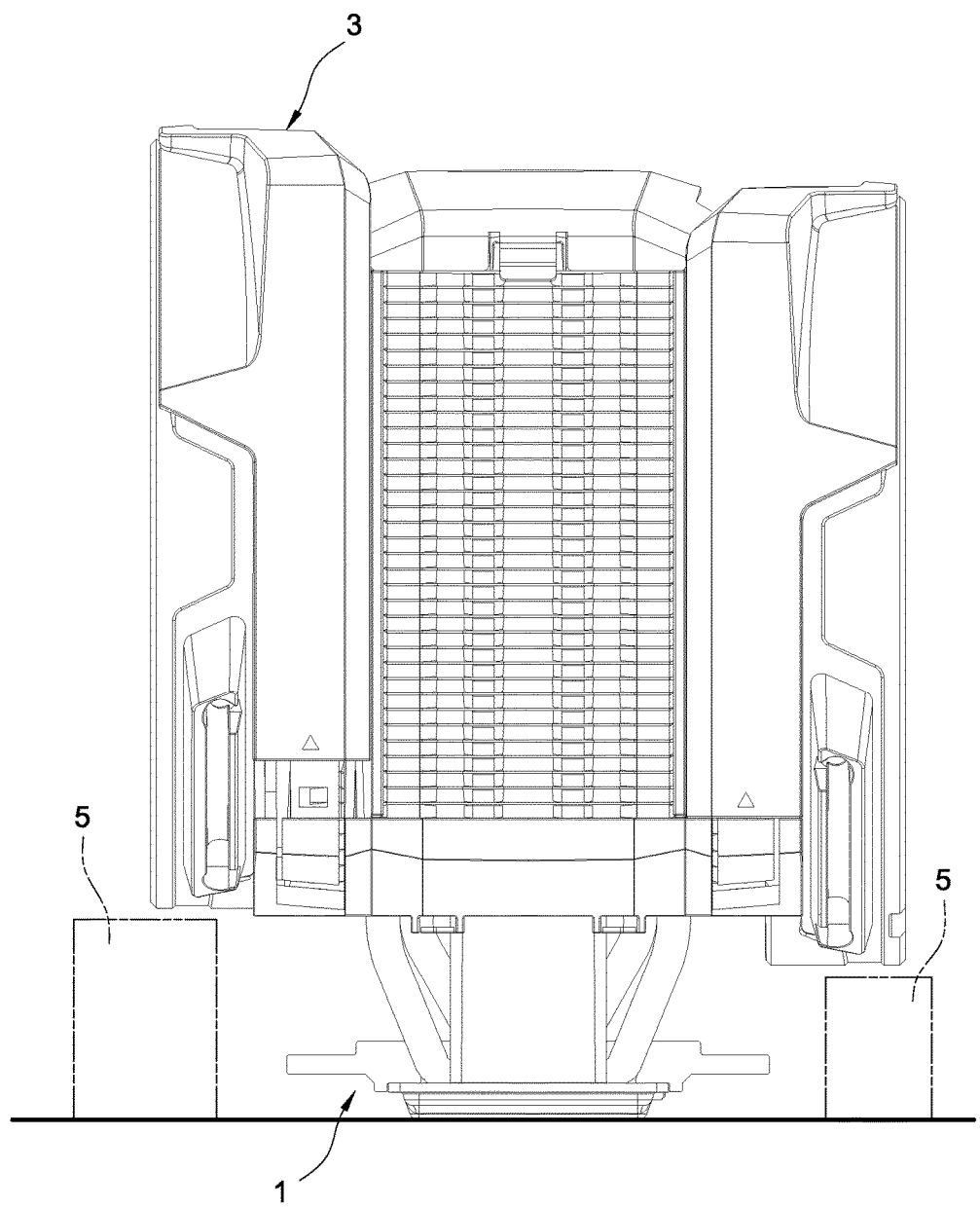
FIG. 7 is an illustration showing an adjustment of the height of the fan module provided in a heat sink assembly of the present invention.

Please refer to FIG. 4. The present invention further allows the brackets 2 to be adjusted for positions on the fan rack 3. During the adjustment of the position of the fan rack 3, it is also equivalent to the adjustment of the position of the fan module or the fan 4; therefore, the above only uses the fan rack 3 for illustration. Wherein, a rear end of the first attachment portion 20 of the bracket 2 includes a cantilever arm 201, and the cantilever 201 includes at least one first positioning portion 202 formed to extend along the first sliding portion 200 and arranged space apart from each other. The first positioning portion 202 can be, for example, an indented positioning hole, and a rear end of the cantilever arm 201 includes a pressing portion 203. The second attachment portion 30 of the fan rack 3 includes a second positioning portion 300, which can be, for example, a protruding positioning block. In addition, the second positioning portion 300 is able to correspond to any one of the first positioning portions 202 in order to allow the second positioning portion 300 to selectively lock onto any one of the first positioning portion 202 when the second sliding portion 31 slidably cooperates with the first sliding portion 200. Accordingly, as shown in FIG. 5 and FIG. 6, when the fan rack 3 is to be removed or when the position of the height of the fan rack 3 is to be adjusted, a user only needs to press on the pressing portion 203 in order to disengage the first and second positioning portions 202, 300 from each other such that the fan rack 3 can be slidably removed from the top, or the second positioning portion 300 can be locked onto another first positioning portion 202, as shown in FIG. 7. By adjusting the position of the height of the fan rack 3, the heat sink 1 can be installed to cooperate with other surrounding electronic unit 5 in order to allow the fan 4 to avoid the interference with the surrounding electronic unit 5 while being properly installed on the heat sink 1.

Figure 8:
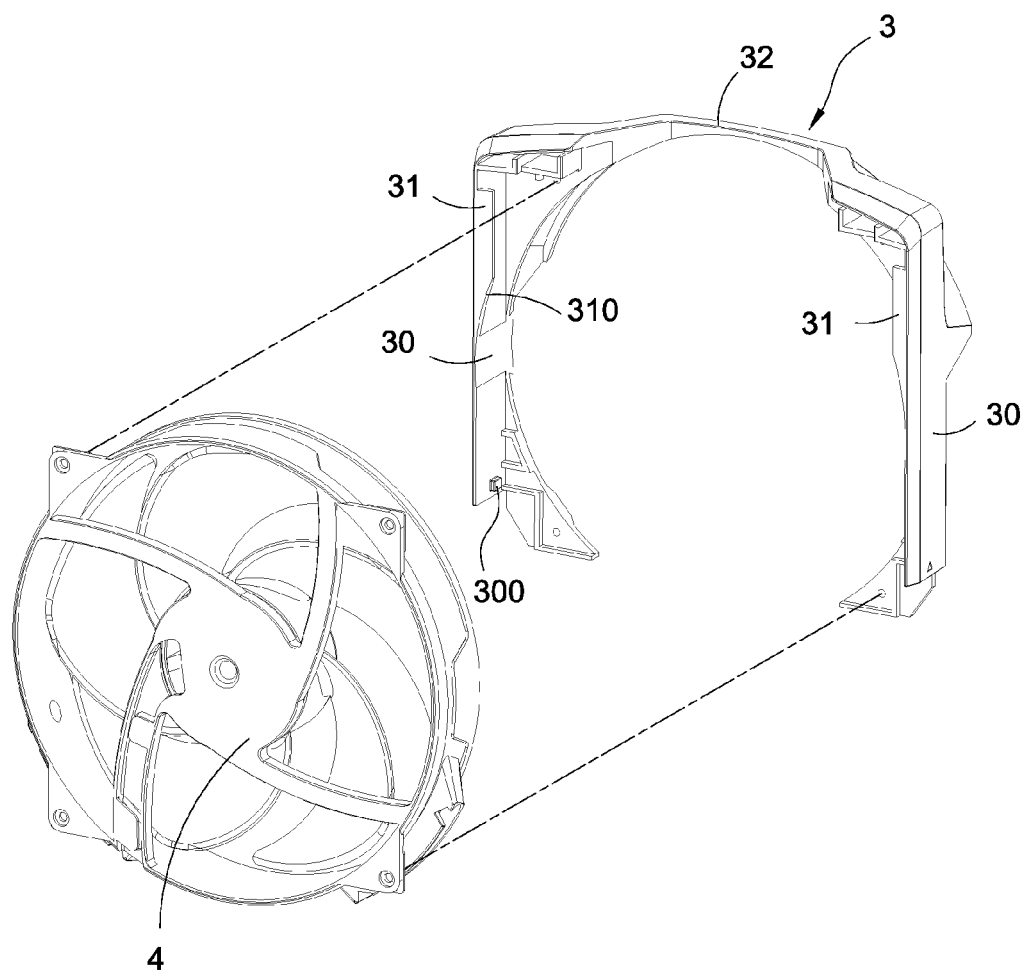
FIG. 8 is a perspective exploded view of a fan rack according to a first embodiment of a fan module of the present invention.
Figure 9:
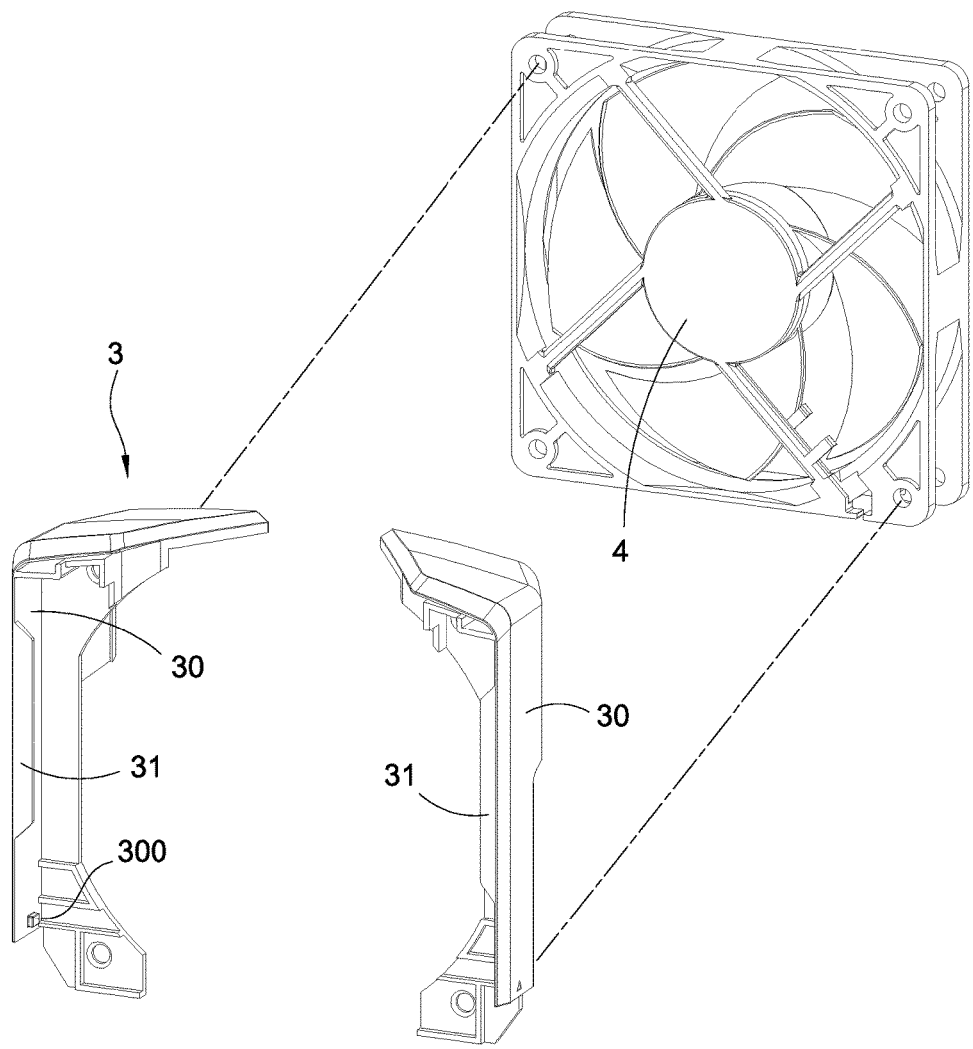
FIG. 9 is a perspective exploded view of a fan rack according to a second embodiment of a fan module of the present invention.

In addition, please refer to FIG. 8, showing a perspective exploded view of a fan rack according to a first embodiment of a fan module of the present invention. Wherein, the fan rack 3 can further comprise a bracket connection portion 32 connected between the pair of second attachment portions 30 and arranged to circumference one side of the fan 4. Furthermore, the second sliding portion 31 can also include a guiding edge 310 formed at a front end of the sliding track in order to achieve the effect of guiding when the sliding track (second sliding portion 31) and the sliding slot (first sliding portion 200) are provided to cooperate with each other. Moreover, please refer to FIG. 9, showing a perspective exploded view of a fan rack according to a second embodiment of a fan module of the present invention. Wherein, the pair of second attachment portions 30 of the fan rack 3 can also be independent from each other such that they are attached to one side of the fan 4 respectively.

Figure 10:
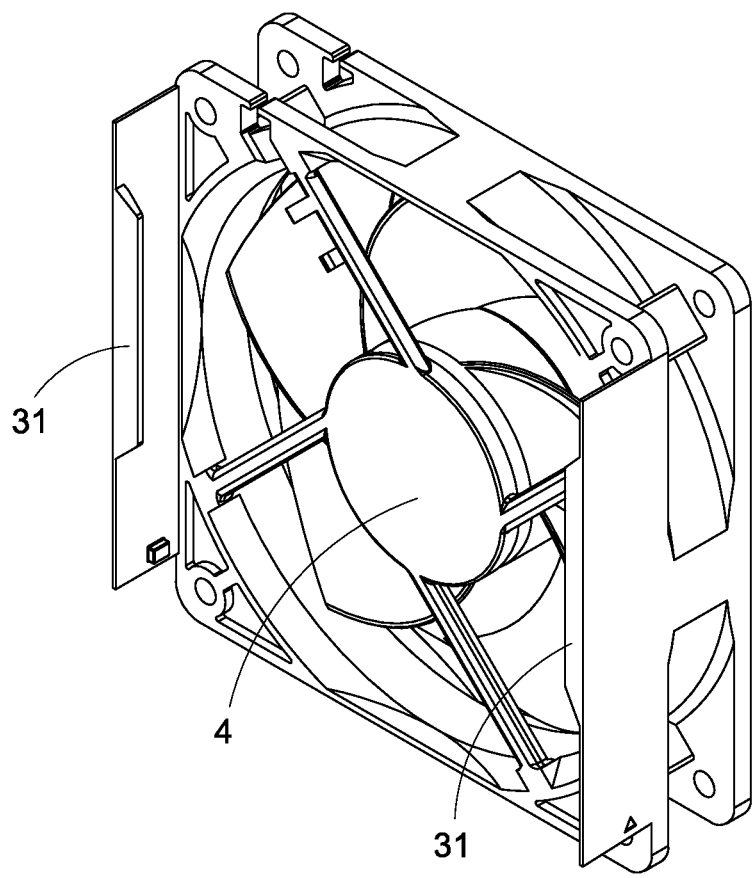
FIG. 10 is a perspective view of a fan of the present invention.

Furthermore, please refer to FIG. 10. The present invention further provides a fan 4. The fan 4 is applicable to be detachably arranged on heat sink 1. The fan 4 includes a second sliding portion 31 configured corresponding to the first sliding portion 200 of the heat sink 1 with a slidable cooperation in order to achieve the objective and effect as mentioned above.

Accordingly, with the aforementioned structure and assembly, the heat sink assembly, the fan and the fan module thereof of the present invention can be achieved.

In view of the above, the present invention is a unique inventive product capable of achieving the expected purpose of use while overcoming the drawbacks of the prior arts. In addition, it is of novelty and inventive step while complying with the patentability requirement for a patent and is legitimately applied in light of the grant of the patent right and the protection of the invention of the inventor.

It shall be noted that the above description provides preferred embodiments of the present invention only, which shall not be treated as limitation of the scope of the present invention. Any equivalent techniques and technical modifications based on the content of the specification and drawings of the present invention shall be deemed to be within the scope of the present invention.

What is claimed is:

1. A heat sink assembly, comprising:
   a heat sink;
   a heat sink rack detachably arranged on the heat sink, and the heat sink rack having a first sliding portion and a cantilever arm having a plurality of first positioning portions and movable between an engaged positon and a pressed position, wherein the heat sink rack comprises a pair of brackets, the pair of brackets include a first attachment portion formed thereon respectively, the first attachment portions extend along a predefined direction, and the first sliding portion is a groove formed on the first attachment portions and extending along the predefined direction; and
   a fan rack having a pair of second attachment portions, a second sliding portion and a second positioning portion, wherein the second sliding portion is a protrusion protruding from the second attachment portions and is slidably disposed in the first sliding portion so that the fan rack is slidably disposed on the heat sink rack in the predefined direction;
   wherein a rear end of the first attachment portion of the pair of brackets includes the cantilever arm, the plurality of first positioning portions are holes formed on the cantilever arm to extend along the first sliding portion and arranged spaced apart from each other, and the second positioning portion is a block that is formed on the second attachment portion of the fan rack and fits any one of the plurality of first positioning portions, and the second positioning portion corresponds to any one of the first positioning portions to lock onto each other for positioning thereon;
   wherein while the cantilever arm is in the engaged position, the second positioning portion is directly engaged into one of the first positioning portions so that the fan rack is fixed on the heat sink rack; while a force is applied on the cantilever arm to deform the cantilever arm so as to force the cantilever arm to move from the engaged position to the pressed position, the plurality of first positioning portions are disengaged from the second positioning portion so as to detach the heat sink rack from the fan rack.

2. The heat sink assembly according to claim 1, wherein the heat sink comprises a base and a plurality of fins formed on the base.

3. The heat sink assembly according to claim 2, wherein the plurality of fins are stacked onto the base, and a heat pipe is disposed between the base and the plurality of fins, and the heat pipe penetrates through the plurality of fins to attach onto the base.

4. The heat sink assembly according to claim 1, wherein the pair of brackets further include a frame portion for the first attachment portion to attach onto the heat sink respectively.

5. The heat sink assembly according to claim 1 wherein a rear end of the cantilever arm includes a pressing portion.

6. The heat sink assembly according to claim 1, further comprising a fan, the fan is installed onto the fan rack.

7. The heat sink assembly according to claim 6, wherein the fan rack further comprises a bracket connection portion, the bracket connection portion is connected between the pair of second attachment portions and is arranged to circumference one side of the fan.

8. The heat sink assembly according to claim 1, further comprising a bracket connection portion, the bracket connection portion connected between the pair of second attachment portions, the bracket connection portion is arranged to circumference one side of the fan.

9. The heat sink assembly according to claim 1, wherein the heat sink comprises a base and a plurality of fins formed on the base and arranged face-to-face along the predefined direction, and the heat sink rack extends along the predefined direction.

10. The heat sink assembly according to claim 9, wherein the plurality of fins have a plurality of gaps therebetween, and the cantilever arm is disposed across part of the plurality of gaps of the plurality of fins.

11. A heat sink assembly, comprising:
    a heat sink;
    a heat sink rack arranged on the heat sink, and the heat sink rack having two first sliding portions; wherein the heat sink rack comprises a pair of brackets respectively fixed at two opposite sides of the heat sink, each of the brackets includes a first attachment portion extending along a predefined direction, the first sliding portions are respectively disposed on the first attachment portions and extend along the predefined direction; and
    a fan rack having two second sliding portions, the fan rack comprising a pair of second attachment portions respectively disposed on the second sliding portions, the second sliding portions configured corresponding to the first sliding portions with a slidable cooperation so that the fan rack is slidably disposed on the heat sink rack in the predefined direction through the slidable cooperation between the first sliding portions and the second sliding portions;
    wherein each of the first attachment portions comprises a cantilever arm, a plurality of first positioning portions, and a pressing portion, the first positioning portions are indented positioning holes formed on and arranged along the cantilever arm and spaced apart from each other, and the pressing portion is connected to the cantilever arm; the second attachment portions each have a second positioning portion which is a protrusion;
    the second positioning portions are configured to be engaged with two of the first positioning portions, such that the fan rack is able to be selectively positioned in multiple positions with respect to the heat sink rack; and
    when a force is applied on the pressing portion to force the cantilever arm to deform, the first positioning portion is disengaged from the second positioning portion.

* * * * *